United States Patent
Zhou

(10) Patent No.: US 10,553,592 B2
(45) Date of Patent: Feb. 4, 2020

(54) FABRICATION METHOD OF A SEMICONDUCTOR STRUCTURE BY A GATE CUTTING PROCESS WITH MULTIPLE SIDEWALL SPACERS FORMATION IN A DUMMY GATE OPENING

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/909,419

(22) Filed: Mar. 1, 2018

(65) Prior Publication Data

US 2018/0261606 A1    Sep. 13, 2018

(30) Foreign Application Priority Data

Mar. 7, 2017 (CN) .......................... 2017 1 0131234

(51) Int. Cl.
*H01L 27/11* (2006.01)
*H01L 21/8238* (2006.01)
(Continued)

(52) U.S. Cl.
CPC ...... *H01L 27/1104* (2013.01); *H01L 21/0217* (2013.01); *H01L 21/02164* (2013.01);
(Continued)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856;
(Continued)

(56) References Cited

U.S. PATENT DOCUMENTS 9,064,932 B1 * 6/2015 Pham .............. H01L 21/823437
9,331,074 B1 * 5/2016 Chang ................. H01L 27/0886
(Continued)

*Primary Examiner* — Younes Boulghassoul
(74) *Attorney, Agent, or Firm* — Anova Law Group, PLLC

(57) ABSTRACT

Semiconductor structure and fabrication method are provided. The method includes: providing a base substrate including a first region, a second region and a third region between the first and the second region; forming a dummy gate structure extending from the first region to the second region and through the third region; forming first doped source/drain regions in the base substrate on both sides of the dummy gate structure in the first region; forming second doped source/drain regions in the base substrate on both sides of the dummy gate structure in the second region; forming an opening in the dummy gate structure in the third region and exposing the base substrate in the third region; and forming an interlayer dielectric layer within the opening to have a top surface coplanar with the dummy gate structure.

17 Claims, 6 Drawing Sheets

(51) Int. Cl.
*H01L 29/66* (2006.01)
*H01L 21/02* (2006.01)
*H01L 21/321* (2006.01)
*H01L 27/092* (2006.01)
*H01L 21/762* (2006.01)
*H01L 29/08* (2006.01)

(52) U.S. Cl.
CPC .. *H01L 21/32115* (2013.01); *H01L 21/76224* (2013.01); *H01L 21/823814* (2013.01); *H01L 21/823821* (2013.01); *H01L 21/823828* (2013.01); *H01L 21/823878* (2013.01); *H01L 27/0924* (2013.01); *H01L 29/0847* (2013.01); *H01L 29/6653* (2013.01); *H01L 29/6656* (2013.01); *H01L 29/66545* (2013.01); *H01L 21/02271* (2013.01); *H01L 21/823864* (2013.01)

(58) Field of Classification Search
CPC ... H01L 2029/7857–7858; H01L 2924/13067; H01L 21/76224; H01L 21/823481; H01L 21/823857; H01L 21/823864; H01L 21/823878; H01L 29/6656; H01L 29/66553; H01L 29/6653; H01L 21/823468; H01L 29/66545; H01L 29/66606; H01L 29/66871; H01L 21/823437; H01L 21/823828
See application file for complete search history.

(56) References Cited

U.S. PATENT DOCUMENTS

| | | | |
|---|---|---|---|
| 9,899,267 B1* | 2/2018 | Liou | H01L 21/823878 |
| 9,911,736 B1* | 3/2018 | Zang | H01L 27/0886 |
| 9,972,495 B1* | 5/2018 | Wu | H01L 21/28123 |
| 10,128,156 B1* | 11/2018 | Chiang | H01L 21/823468 |
| 2015/0255557 A1* | 9/2015 | Zhu | H01L 29/78 |
| 2016/0133632 A1* | 5/2016 | Park | H01L 21/823828 257/369 |
| 2016/0148846 A1* | 5/2016 | Ok | H01L 21/28008 257/369 |
| 2016/0307767 A1* | 10/2016 | Lee | H01L 29/66795 |
| 2017/0148682 A1* | 5/2017 | Basker | H01L 21/823431 |
| 2017/0345820 A1* | 11/2017 | Lin | H01L 21/823481 |
| 2017/0358585 A1* | 12/2017 | Lim | H01L 27/1104 |
| 2019/0103325 A1* | 4/2019 | Huang | H01L 21/823878 |

* cited by examiner

US 10,553,592 B2

FABRICATION METHOD OF A SEMICONDUCTOR STRUCTURE BY A GATE CUTTING PROCESS WITH MULTIPLE SIDEWALL SPACERS FORMATION IN A DUMMY GATE OPENING

CROSS-REFERENCES TO RELATED APPLICATION

This application claims the priority of Chinese Patent Application No. 201710131234.3, filed on Mar. 7, 2017, the content of which is incorporated herein by reference in its entirety.

TECHNICAL FIELD

The present disclosure generally relates to the field of semiconductor technologies and more particularly, relates to a semiconductor structure for a static random access memory (SRAM) and its fabrication method.

BACKGROUND

As the integration level of semiconductor devices continuously increases, critical dimensions of a static random access memory (SRAM) continues decreasing.

A conventional SRAM cell usually includes a 6T structure. Such SRAM cell having 6T structure usually includes a memory unit and two read/write units. The memory unit includes two pull-up transistors and two pull-down transistors. In the memory unit, the two pull-up transistors connect to word lines and the two pull-down transistors connect to ground lines. The memory unit includes two storage nodes and two opening nodes, for storing 1 or 0 signal. The two read/write units in the SRAM cell are two transmission transistors. One end of each transmission transistor is connected to a storage node and an opening node of the memory unit respectively. The other end of each transmission transistor is connected to a bit line for reading/writing on the memory unit respectively.

However, the fabrication of SRAM becomes more difficult due to the reduction of the critical dimensions of the SRAM. The disclosed devices and methods are directed to at least partially alleviate one or more problems set forth above and to solve other problems in the art.

SUMMARY

One aspect of the present disclosure provides a fabrication method of a semiconductor structure. The method includes: providing a base substrate including a first region, a second region and a third region between the first and the second region; forming a dummy gate structure extending from the first region to the second region and through the third region; forming first doped source/drain regions in the base substrate on both sides of the dummy gate structure in the first region; forming second doped source/drain regions in the base substrate on both sides of the dummy gate structure in the second region; forming an opening in the dummy gate structure in the third region and exposing the base substrate in the third region; forming an interlayer dielectric layer within the opening. The interlayer dielectric layer has a top surface coplanar with the dummy gate structure. The method can reduce the difficulty in forming the interlayer dielectric layer in the opening.

Another aspect of the present disclosure provides a semiconductor structure. The semiconductor structure includes: a base substrate including a first region, a second region and a third region between the first and second region; a dummy gate structure extending from the first region to the second region and through the third region; first doped source/drain regions in the base substrate on both sides of the dummy gate structure in the first region; second doped source/drain regions in the base substrate on both sides of the dummy gate structure in the second region; and an interlayer dielectric layer in the dummy gate structure in the third region and exposing the base substrate in the third region. The interlayer dielectric layer has a top surface coplanar with the dummy gate structure.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
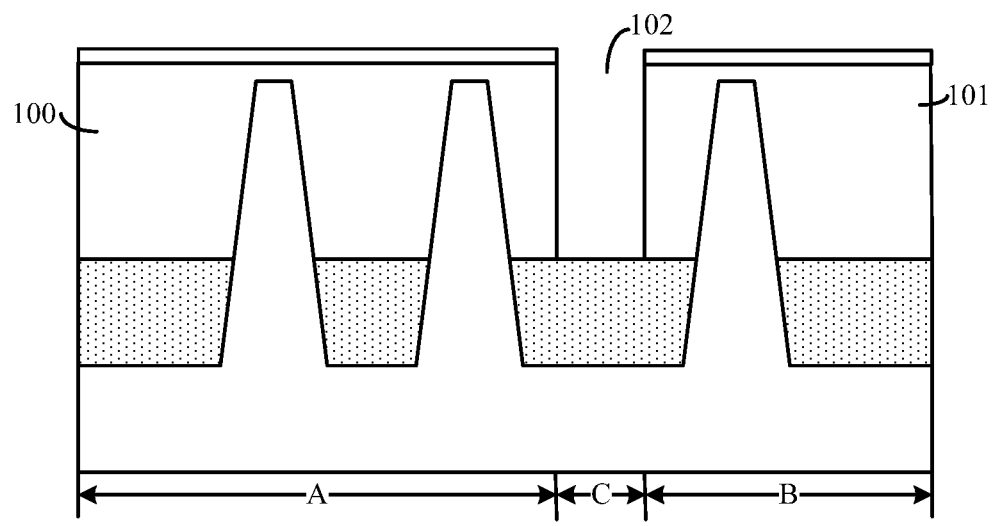
FIG. 1 and FIG. 2 illustrate semiconductor structures corresponding to certain stages for forming a static random access memory (SRAM)
Figure 2:
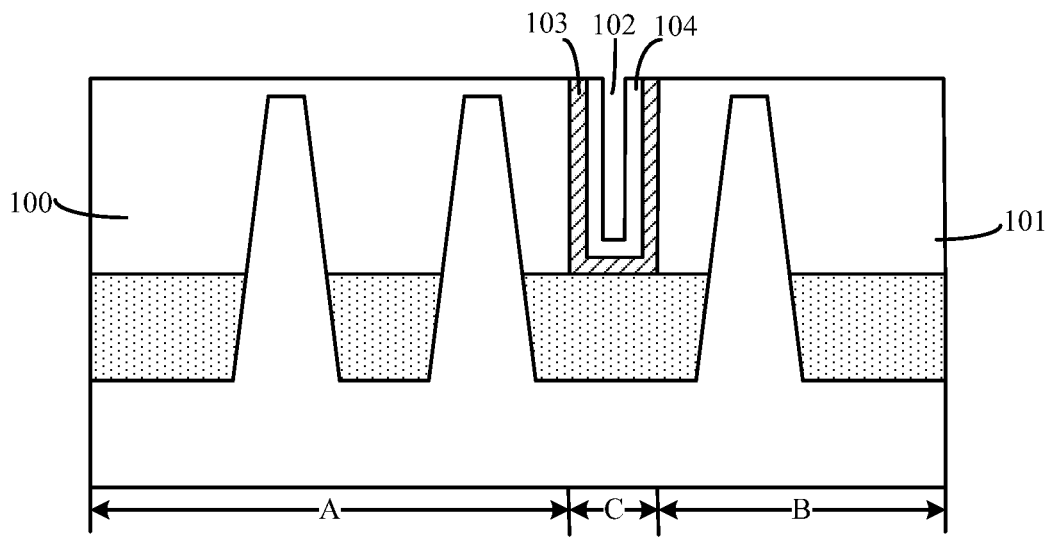
Figure 3:
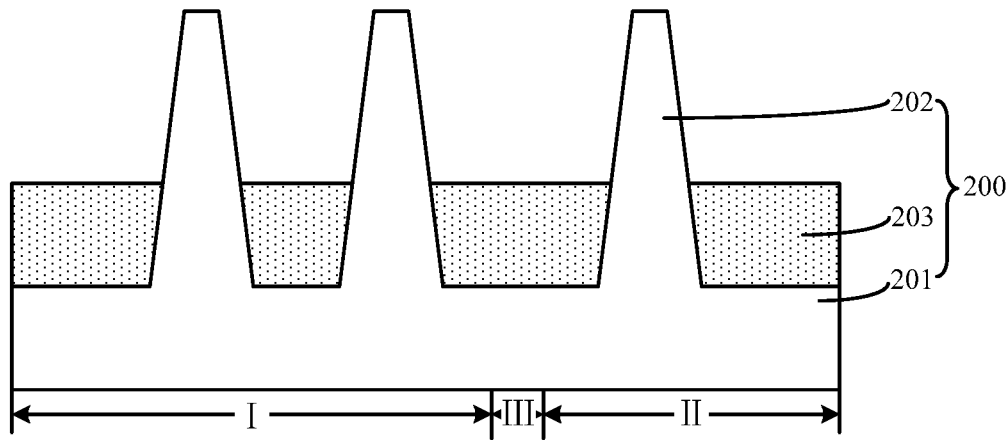
FIGS. 3-13 illustrate semiconductor structures corresponding to certain stages for forming an exemplary semiconductor structure according to various disclosed embodiments of the present disclosure.

FIGS. 1-2 illustrate semiconductor structures corresponding to certain stages for forming a static random access memory (SRAM).

As shown in FIG. 1, a base substrate is provided. The base substrate includes a first region A, a second region B and a third region C between the first region A and the second region B. A first dummy gate structure 100 is formed on the base substrate in the first region A, and a second dummy gate structure 101 is formed on the base substrate in the second region B. An opening 102 is formed on the base substrate in the third region C to expose the base substrate in the third region C.

The first region A is used to form a pull-up transistor and the second region is used to form an output transistor. The third region C is used to form an interlayer dielectric layer between the gate structure of the pull-up transistor and the gate structure of the output transistor.

As shown in FIG. 2, first doped source/drain regions are formed in the base substrate on both sides of the first dummy gate structure 100, and second doped source/drain regions are formed in the base substrate on both sides of the second dummy gate structure 101, after forming the opening 102.

Before forming the first doped source/drain regions, a first protecting layer 103 is formed in the opening 102 and on the second dummy gate structure 101. The processes to form the first protecting layer 103 include: forming a first protecting film on the base substrate, the first dummy gate structure 100, the second dummy gate structure 101 and in the opening 102; and removing a portion of the first protecting film on the base substrate in the first region A and on the first dummy gate structure 100, to form the first protecting layer 103.

The processes for forming the first doped source/drain regions include: forming first openings in the base substrate on the both sides of the first dummy gate structure by an etching process; forming epitaxial layers in the first openings by a selective epitaxial deposition method; and doping the epitaxial layers to form the first doped source/drain regions.

Before forming the second doped source/drain regions, a second protecting layer 104 is formed in the opening 102 and on the first dummy gate structure 100. The processes for forming the second protecting layer 104 include: forming a second protecting film on the base substrate, the first dummy gate structure 100, and the first protecting layer 103; and removing a portion of the first and second protecting film on the base substrate of the second region B and on the second dummy gate structure 101, to form the first protecting layer 104.

The processes for forming the second doped source/drain regions include: forming second openings in the base substrate on both sides of the second dummy gate structure 101 by the etching process; forming epitaxial layers in the second openings by the selective epitaxial deposition method; doping the epitaxial layers to form the second doped source/drain regions.

The subsequent process includes forming an interlayer dielectric layer inside the opening 102. The opening 102 is formed before the first and second doped source/drain region. Moreover, the first protecting layer 103 is formed on the base substrate in the second region B and the third region C, on the second dummy gate structure 101 and in the opening 102, after the forming the opening 102 but before forming the first doped source/drain regions. Subsequently, the first openings are formed in the base substrate on both sides of the first dummy gate structure 100 by the etching process when forming the first doped source/drain regions. In this process, the first protecting layer 103 protects the base substrate of the second region B and third region C, the opening 102 and the second dummy gate structure 101. Therefore the thickness of the first protecting layer 103 must be large enough to provide an adequate protection capability. However, the first protecting layer 103 covers the opening 102 and reduces the size of the opening 102 along the extending direction of the first dummy gate structure 100. Correspondingly, it becomes difficult to form the interlayer dielectric layer inside the opening 102.

The second doped source/drain regions are formed after the first doped source/drain regions. The second protecting layer 104 is formed on the base substrate of the first region A and the third region C, on the first dummy gate structure 100 and in the opening 102, before forming the second doped source/drain regions. Subsequently, the second openings are formed in the base substrate on both sides of the second dummy gate structure 101 by the etching process when forming the second doped source/drain regions. In this process, the second protecting layer 104 protects the base substrate of the first region A and third region C, the opening 102 and the first dummy gate structure 100. Therefore the thickness of the second protecting layer 104 has to be large enough to provide an adequate protecting capability. However, the second protective layer 104 covers the opening 102 and reduces the size of the opening 102 along the extending direction of the first dummy gate structure 100. Correspondingly it becomes difficult to form the interlayer dielectric layer inside the opening 102.

One way to alleviate the difficulty in forming the interlayer dielectric layer in the opening 102 is increasing the size of the opening 102 along the extending direction of the first dummy gate structure 100. However, the total space for forming the pull-up transistors, the output transistors, and the interlayer dielectric layer between the gate structure of the pull-up transistor and the gate structure of the output transistor, is fixed. If the size of the opening 102 along the extending direction of the first dummy gate structure 100 is too large, the space for the dummy gate structures of the pull-up transistors and the output transistors would become small.

A first dummy gate opening is formed by removing the first dummy gate structure 100 subsequently and is used to form the gate structure of the pull-up transistors. If the size of the first dummy gate opening along the extending direction of the dummy gate structure 100 is too small, it would be difficult to form the gate structure of the pull-up transistor inside the first dummy gate opening. Correspondingly the gate structure of the pull-up transistor has poor performance, thereby affecting the performance of SRAM.

Similarly, a second dummy gate opening is formed by removing the second dummy gate structure 101 subsequently, which is used to form the gate structure of the output transistors. If the size of the second dummy gate opening along the extending direction of the second dummy gate structure 101 is too small, it would be difficult to form the gate structure of the output transistor inside the second dummy gate opening. Correspondingly, the gate structure of the formed output transistor has poor performance, thereby affecting the performance of SRAM.

The present disclosure provides a semiconductor structure for SRAM and its fabricating method. The fabrication method includes: providing a base substrate including a first region, a second region and a third region between the first region and the second region; forming a dummy gate structure extending from the first region to the second region and through the third region; forming first doped source/drain regions in the base substrate on both sides of the dummy gate structure in the first region; forming second doped source/drain regions in the base substrate on both sides of the dummy gate structure in the second region; forming an opening in the dummy gate structure in the third region exposing the base substrate in the third region; forming an interlayer dielectric layer inside the opening to provide a top surface coplanar with the dummy gate structure.

The disclosed fabrication methods of a semiconductor structure are directed to at least partially alleviate one or more problems set forth above and to solve other problems in the art.

FIGS. 3-13 illustrate semiconductor structures corresponding to certain stages for forming an exemplary semiconductor structure for SRAM according to various disclosed embodiments of present disclosure. FIG. 14 illustrates an exemplary method for forming a semiconductor structure for SRAM according to various disclosed embodiments.

In FIG. 1, A base substrate 200 is provided (e.g., in Step S802 in FIG. 14). The base substrate 200 may include a first region I, a second region II and a third region III between the first region I and the second region II.

In one embodiment, the base substrate 200 may include a semiconductor substrate 201 and fins 202 protruding from the semiconductor substrate 201. The semiconductor substrate 201 and the fins 202 may provide a platform for the subsequent processes.

In other embodiments, the base substrate may be a planar semiconductor substrate.

The processes for forming the semiconductor substrate 201 and the fins 202 may include: providing an initial substrate; forming a patterned mask layer on the surface of the initial substrate; and etching the initial substrate by using the patterned mask layer as an etching mask to form the semiconductor substrate 201 and the fins 202 protruding from the semiconductor base 201.

In various embodiments, the initial substrate may be made of a material including silicon (Si), germanium (Ge), SiGe, silicon on an insulator (SOI) substrate, and/or germanium on an insulator (GOI) substrate.

In one embodiment, the base substrate 200 may further include an isolation structure 203.

The processes for forming the isolation structure 203 may include: forming a layer of isolating material on the semiconductor substrate 201 and the fins 202; planarizing the layer of isolating material by a chemical mechanical polishing method; and removing a portion of the layer of isolating material to form the isolation structure 203. The isolation structure 203 may be formed on a portion of the semiconductor substrate 201 between the fins 202 and cover a portion of sidewalls of the fins 202. The top surface of the isolation structure 203 may be lower than the top surface of the fins 202.

In some embodiments, the layer of isolating material may be formed by a chemical vapor deposition method. The isolation structure 203 may be made of silicon oxide ($SiO_2$), silicon nitride (SiN), or $SiN_xO_y$.

The isolation structure 203 may be used to electrically insulate the different semiconductor devices from each other.

In one embodiment, the formed semiconductor structure may be used to fabricate SRAM. The first region I may be used to form the pull-up transistor, the second region II may be used to form the output transistor and the third region III may be used to form the interlayer dielectric layer between the pull-up and the output transistor.

In other embodiments, the first region I may be used to form a PMOS transistor, the second region II may be used to form an NMOS transistor, and the third region III may be used to form the interlayer dielectric layer.

Figure 4:
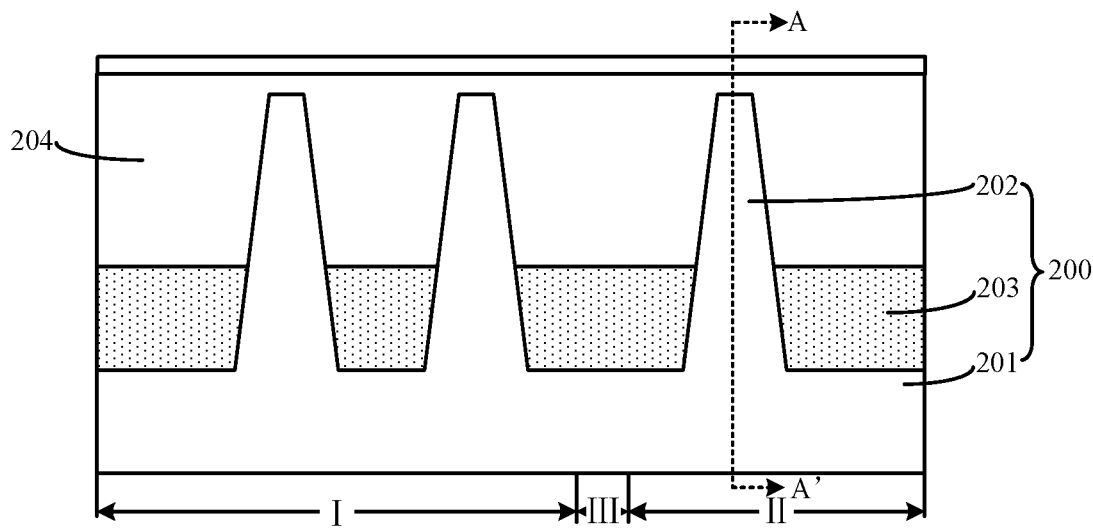
Figure 5:
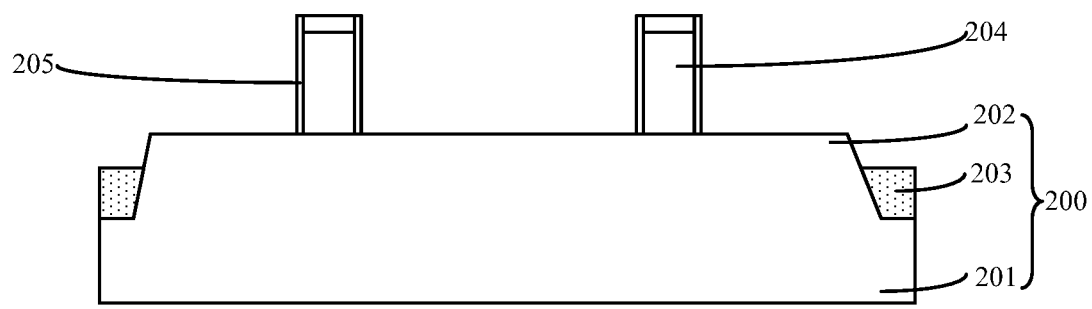

FIG. 4 and FIG. 5 show the formation of a dummy gate structure 204 extending from the first region I to the second region II and through the third region III (e.g., in Step S804 in FIG. 14). FIG. 4 is a three-dimensional schematic structure and FIG. 5 is a cross-sectional view along the A-A' line in FIG. 4.

The dummy gate structure 204 may cross the fins 202, and may include a dummy gate dielectric layer and a dummy gate layer on the dummy gate dielectric layer. The dummy gate dielectric layer may cover a portion of the top surfaces and sidewalls of the fins 202.

In various embodiments, the dummy gate dielectric layer may be made of silicon oxide ($SiO_2$), silicon nitride (SiN), or $SiN_xO_y$, and the dummy gate layer may be made of polycrystalline silicon.

In one embodiment, a mask layer may be formed on the top surface of the dummy gate structure 204, which is not shown in the figure. The mask layer may be made of SiN and may be used as an etching mask to form the dummy gate layer by etching.

The dummy gate structure may include dummy gate sidewall spacers 205. The process steps to form the dummy gate sidewall spacers 205 may include: forming dummy gate sidewall spacer films on the sidewalls of the dummy gate dielectric layer, on a top and sidewalls of the dummy gate layer and on the fins 202 of both sides of the dummy gate layer; removing the dummy gate sidewall spacer films on the top of the dummy gate layer and on the fins of the both sides of the dummy gate layer, to form the dummy gate sidewall spacers 205.

The dummy gate sidewall spacer films may be formed by the chemical vapor deposition method.

The dummy gate sidewall spacer films may be made of a same material as the dummy gate sidewalls 205. In one embodiment, the dummy gate sidewall spacer films may be made of SiN.

The dummy gate sidewall spacers 205 may be used to define the position of the first doped source/drain regions and the second doped source/drain regions relative to the dummy gate structure 204.

The method to remove the dummy gate sidewall spacer films on the top of the dummy gate layer and on the fins of both sides of the dummy gate layer may be a dry etching method or a wet etching method.

Figure 6:
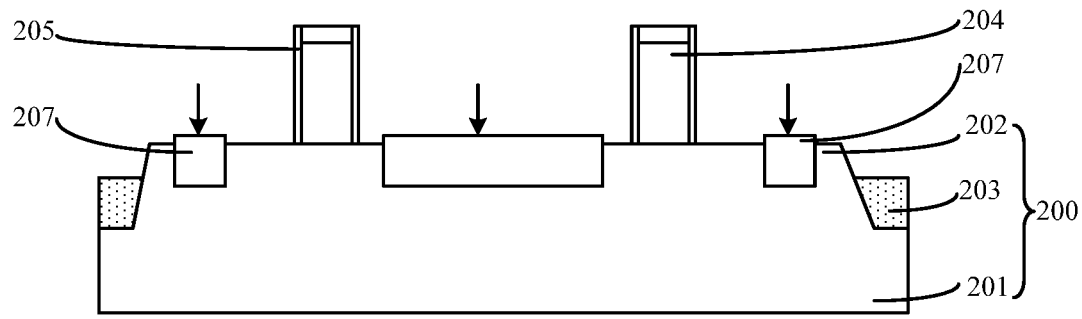

The first doped source/drain regions (not illustrated) may be formed in the fins 202 on both sides of the dummy gate structure 204 in the first region I, and the second doped source/drain regions 207 may be formed in the fins 202 on both sides of the dummy gate structure 204 in the second region II, as shown in FIG. 6 (e.g., in Step S806 in FIG. 14). FIG. 6 is along the same direction in FIG. 5.

In various embodiments, the second doped source/drain regions 207 may be formed either before or after forming the first doped source/drain region.

Before forming the first doped source/drain regions, a first protecting layer may be formed on the base substrate 200 in the second region II and the third region III, and on the dummy gate structure 204 in the second region II and the third region III.

The processes for forming the first protecting layer may include: forming a first protecting film (not labeled) on the base substrate 200 and the dummy gate structure 204 in the first region I, the second region II and the third region III; and removing a portion of the protecting film on the base substrate 200 and the dummy gate structure 204 in the first region I, to form the first protecting layer.

The thickness of the first protecting layer may be about 6 nm to about 10 nm. In the subsequent process for forming the first doped source/drain regions, the first protecting layer may protect the base substrate 200 in the second region II, the base substrate 200 in the third region III, and the dummy gate structure 204 extending from the third region III to the second region II. If the thickness of the first protecting layer is less than 6 nm, the first protecting layer may not have enough protective capability on the base substrate 200 in the second II, the base substrate 200 in the third region III, and the dummy gate structure 204 extending from the third region III to the second region II. This may induce the damage to the base substrate 200 in the second region II, the base substrate 200 in the third region III, and the dummy gate structure 204 extending from the third region III to the second region II, and affect the subsequent process. If the thickness of the first protecting layer is larger than 10 nm, it may increase the difficulty to remove the first protecting layer on the dummy gate structure 204 in the second region II subsequently.

In the present disclosure, the first protecting layer is formed before forming an opening, so it has no influence on the size of the opening along the extending direction of the dummy gate structure 204 and it is easy to form an interlayer dielectric layer inside the opening subsequently. Moreover, it also may effectively prevent the opening from becoming excessively large as long as the interlayer dielectric layer can be formed inside the opening since the sidewalls and the bottom of the opening are not covered by the first protecting layer.

The first doped source/drain regions 206 may be formed in the base substrate 200 on the both sides of the dummy gate structure 204 in the first region I, after forming the first protecting layer on the base substrate 200 in the second region II and the third region III, on the dummy gate structure 204 in the second region II and the third region III.

The processes for forming the first doped source/drain regions may include: forming a patterned mask layer on the fins 202 on both sides of the dummy gate structure 204 in the first region I; forming first openings in the fins 202 on the both sides of the dummy gate structure 204 by etching process; forming epitaxial layers in the first openings by a selective epitaxial deposition method; and doping the epitaxial layers to form the first doped source/drain regions.

Before forming the second doped source/drain regions, a second protecting layer may be formed on the base substrate 200 in the first region I and the third region III, on the dummy gate structure 204 in the first region I and the third region III.

The processes for forming the second protecting layer may include: forming a second protecting film on the base substrate 200 and the dummy gate structure 204 of the first region I, the second region II and the third region III; and removing a portion of the protecting film on the base substrate 200 and the dummy gate structure 204 in the second region II to form the second protecting layer.

The thickness of the second protecting layer may be about 6 nm to about 10 nm. In the subsequent process for forming the second doped source/drain region 207, the second protecting layer may protect the base substrate 200 in the first region I, the base substrate 200 in the third region III, and the dummy gate structure 204 extending from the third region III to the first region I. If the thickness of the second protecting layer is less than 6 nm, the second protecting layer would not have enough protecting capability on the base substrate 200 in the first region I, the base substrate 200 in the third region III, and the dummy gate structure 204 extending from the third region III to the first region I. This would induce the damage on the base substrate 200 in the first region I, the base substrate 200 in the third region III, and the dummy gate structure 204 extending from the third region III to the first region I, affecting the subsequent process. If the thickness of the first protecting layer is larger than 10 nm, removing the second protecting layer on the dummy gate structure 204 in the second region II subsequently would become difficult.

The second protecting layer is formed before forming the opening, so it has no influence on the size of the opening in the extending direction of the dummy gate structure 204 and it is easy to form the interlayer dielectric layer in the opening subsequently. Moreover, it may effectively prevent the opening from becoming excessively large as long as the interlayer dielectric layer can be formed inside the opening since the sidewalls and the bottom of the opening are not covered by the second protecting layer.

The processes for forming the second doped source/drain regions 207 may include: forming a patterned mask layer on the fins 202 on both sides of the dummy gate structure 204 in the second region II; forming second openings in the fins 202 on both sides of the dummy gate structure 204 by etching process; forming epitaxial layers in the second openings by a selective epitaxial deposition method; and doping the epitaxial layers to form the first doped source/drain regions 207.

Figure 7:
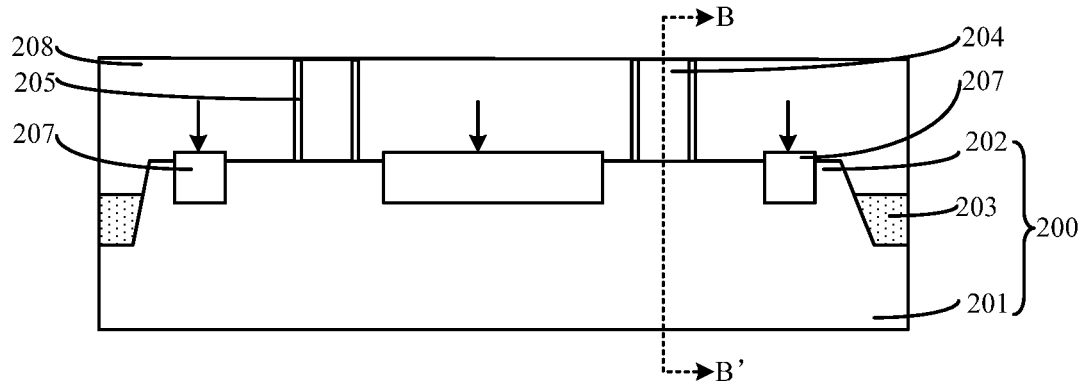
Figure 8:
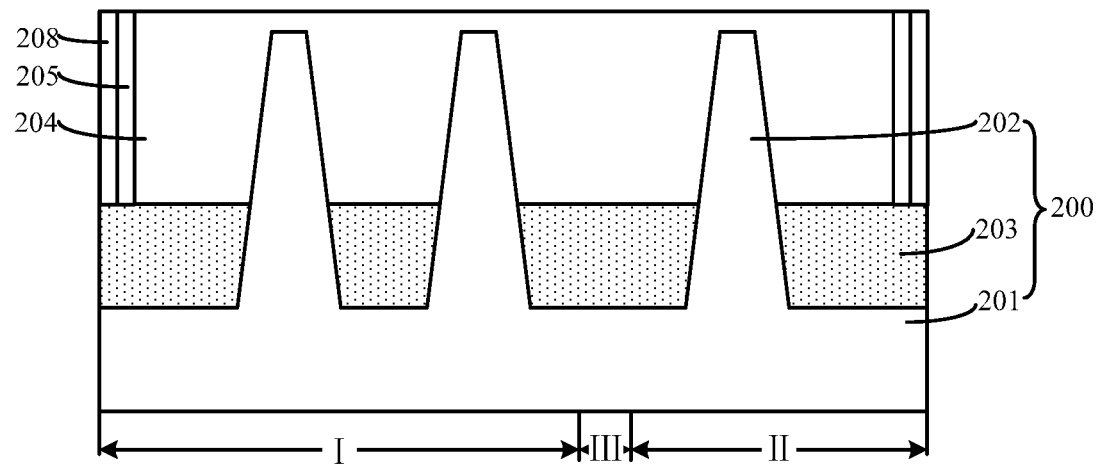

FIG. 7 and FIG. 8 show the formation of a first interlayer dielectric layer 208 on the top surface of the isolation structure 203, of the first doped source/drain region 206, of the second doped source/drain region 207, of the fins 202 and of the dummy gate structure 204. The first interlayer dielectric layer 208 may have a top surface coplanar with the dummy gate structure. FIG. 7 is along the along the A-A' line in FIG. 4 as sane as FIG. 5, and FIG. 8 is the side view along the B-B' line in FIG. 7.

The processes for forming the first interlayer dielectric layer 208 may include: forming a first interlayer dielectric film on the isolation structure 203, the first doped source/drain regions, the second doped source/drain regions 207, the top of the fins 202 and the top of the dummy gate structure 204; and planarizing the first interlayer dielectric film to expose the top surface of the dummy gate structure 204 and form the first interlayer dielectric layer 208.

The method for forming the first interlayer dielectric film may be a chemical vapor deposition method.

The method to planarize the first interlayer dielectric film to expose the top surface of the dummy gate layer may be a chemical mechanical polishing method.

Figure 9:
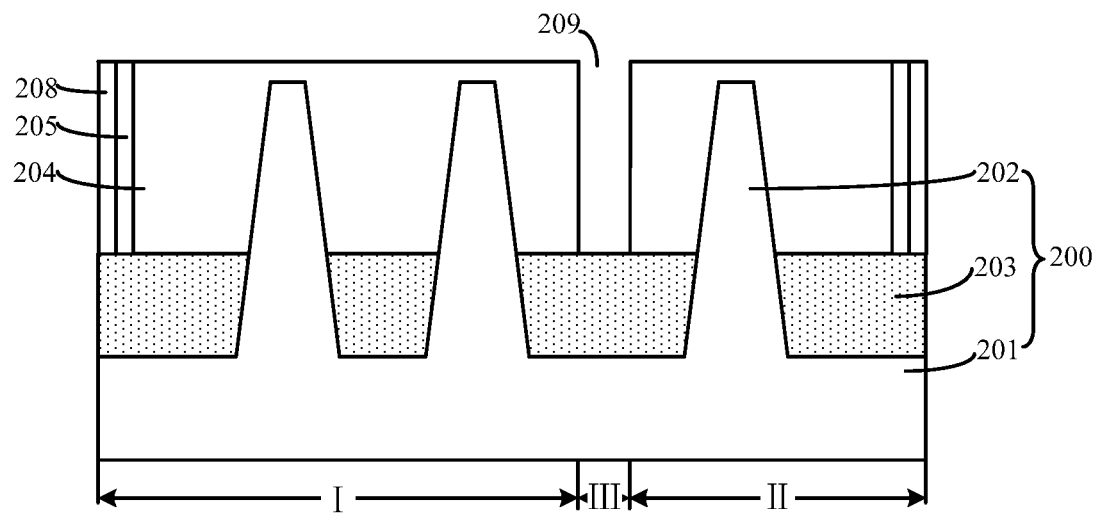

An opening 209 through the dummy gate structure 204 may be formed after forming the first doped source/drain regions 206 and the second doped source/drain regions 207, as shown in FIG. 9. The opening 209 may expose the base substrate 200 in the third region III.

The process for forming the opening 209 may include: removing the dummy gate structure 204 in the third region III, to form the opening 209 which exposes the top surface of the isolation structure 203 in the third region III.

The method to remove the dummy gate structure 204 in the third region III may be a dry etching method or a wet etching method.

In one embodiment, the size of the opening 209 along the extending direction of the dummy gate structure 204 may be about 20 nm to about 40 nm.

If the size of the opening 209 along the extending direction of the dummy gate structure 204 is smaller than 20 nm, forming the interlayer dielectric layer in the opening 209 subsequently may be more difficult.

If the size of the opening 209 along the extending direction of the dummy gate structure 204 is larger than 40 nm, it may help to form the interlayer dielectric layer in the opening 209. However, for SRAM, the total space of the pull-up transistors, the output transistors, and the interlayer dielectric layer between the gate structure of the pull-up transistor and the gate structure of the output transistor is fixed. If the size of the opening 209 along the extending direction of the dummy gate structure 204 is too large, the space for forming the gate structure of the pull-up and output transistors may become too small. Subsequently, the dummy gate structure 204 is removed to form the dummy gate opening which is used to form the gate structure of the pull-up transistor and the output transistor. The dummy gate opening along the extending direction of the dummy gate structure 204 may be too small and be not favor of forming the gate structure of the pull-up transistor and the output transistor in the dummy gate opening, because of above reason.

The interlayer dielectric layer may be formed in the opening 209 subsequently.

The dummy gate structure 204 in the first region I may be removed to form a first dummy gate opening and the dummy gate structure 204 in the second region II may be removed to form a second dummy gate opening, after forming the interlayer dielectric layer.

In one embodiment, the processes to remove the dummy gate structure 204 in the first region I may include: removing the dummy gate layer in the first region I; and removing the dummy gate dielectric layer in the first region I subsequently.

In one embodiment, the processes to remove the dummy gate structure 204 in the second region II may include: removing the dummy gate layer in the second region II; and removing the dummy gate dielectric layer in the second region II subsequently.

In one embodiment, a first sidewall spacer and a second sidewall spacer may be formed on the sidewalls of the opening 209 before removing the dummy gate structure 204 in the first region I and the second region II.

In other embodiments, the process of removing the dummy gate structure 204 in the first region may only include removing the dummy gate layer in the first region.

In other embodiments, the process of removing the dummy gate structure 204 in the second region may only include removing the dummy gate layer in the second region.

Figure 10:
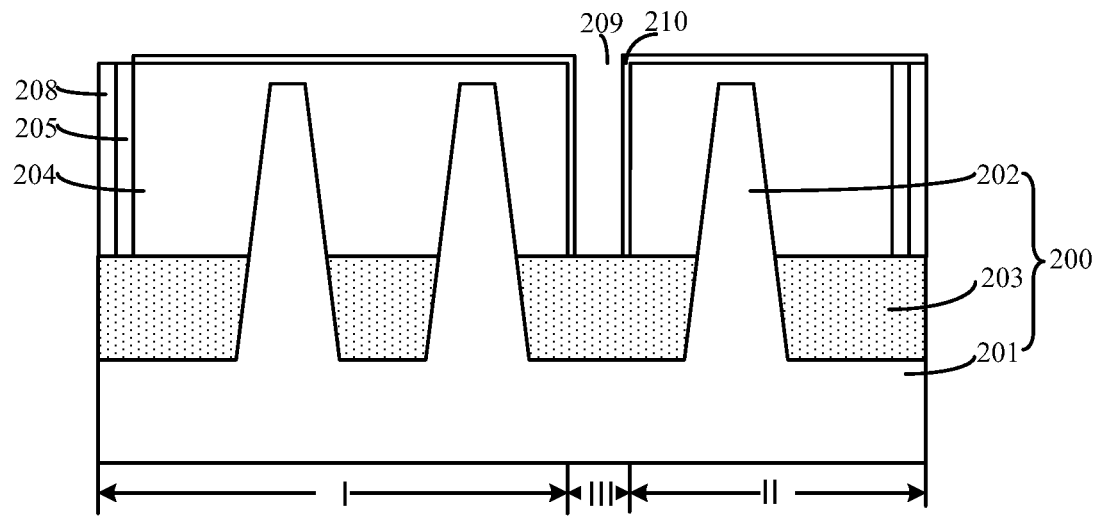
Figure 11:
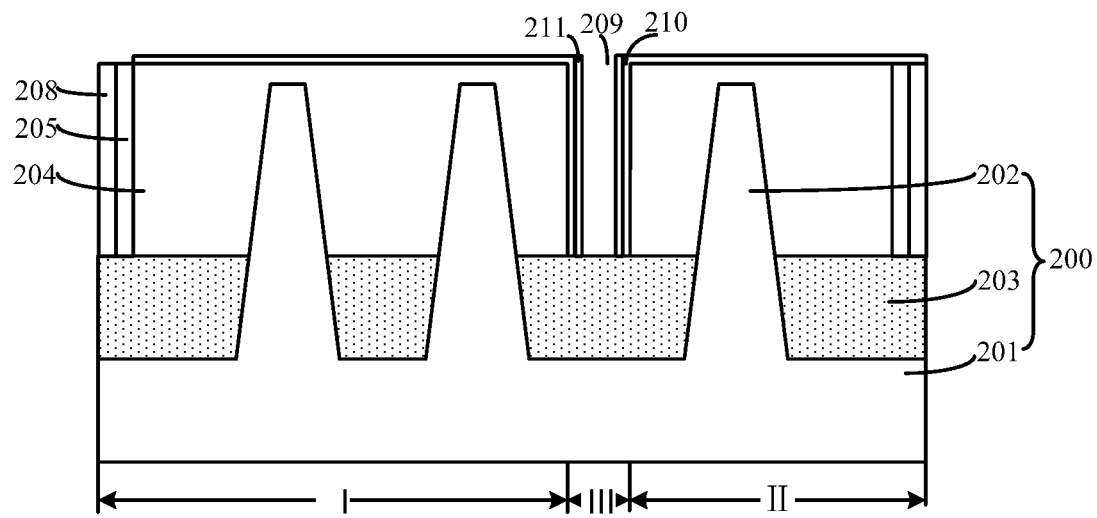

The processes for forming the first sidewall spacer and the second sidewall spacer on the sidewalls of the opening 209 will be illustrated by using removing the dummy gate dielectric layer as an example below, as shown in FIG. 10 and FIG. 11.

FIG. 10 shows forming the second sidewall spacer 210 on the sides of the opening 209.

The process for forming the second sidewall spacer 210 may be a plasma oxidization method. The process parameters of the plasma oxidization method may include: the reactants include silicon precursors (e.g., dichlorosilane) and oxidizing sources; the temperature is about 200° C. to about 600° C.; the pressure is about 1 mTorr to about 10 mTorr; the flow rate of ammonia is about 1500 standard ml/min to about 4000 standard ml/min; and the number of cycles is about 30 times to about 100 times.

The second sidewall spacer 210 formed by the plasma oxidization method may have strong bonding force with the sidewalls of the opening 209, and its thickness may be controllable.

In one embodiment, the sidewalls of the opening 209 may be the dummy gate layers and the dummy gate layers may be made of polycrystalline silicon. The second sidewall spacer 210 may be formed by consuming a portion of the sidewalls of the opening 209 to form the second sidewall spacer 210 by the plasma oxidization process. The second sidewall spacer 210 may be made of silicon oxide ($SiO_2$).

The second sidewall spacer 210 may be used to further expand the size of the dummy gate opening along the extending direction of the dummy gate structure 204. Its mechanism is listed below. The second sidewall spacer 210 may be formed by consuming a portion of the sidewalls of the opening 209 using the plasma oxidization process. The dummy gate structure 204 may be removed by removing the dummy gate layer after forming the second sidewall spacer 210. The dummy gate dielectric layer may be removed after removing the dummy gate layer, and the second sidewall spacer 210 may be also removed in the meantime. Correspondingly the second sidewall spacer 210 can be used to further expand the size of the dummy gate opening along the extending direction of the dummy gate structure 204. This may subsequently reduce the difficulty in filling the dummy gate opening with gate material layers to form the gate structure of the pull-up transistor and the output transistor.

The thickness of the second sidewall spacer 210 may be about 10 angstroms to about 50 angstroms. The second sidewall spacer 210 may be removed when removing the dummy gate dielectric layer. If the thickness of the second sidewall spacer 210 is less than about 10 angstroms, the effect of increasing the size of the dummy gate opening along the extending direction of the dummy gate structure 204 would be weak; if the thickness of the second sidewall spacer 210 is larger than about 50 angstroms, the size of the opening 209 along the extending direction of the dummy gate structure 204 would decrease, and it would be difficult to form the interlayer dielectric layer inside the opening 209 subsequently.

In other embodiments, it may be unnecessary to form the second sidewall spacer 210 on the sidewalls of the opening.

FIG. 11 shows forming the first sidewall spacer 211 on the second sidewall spacer 210.

In one embodiment, the second sidewall spacer 210 may be formed before forming the first sidewall spacer 211.

In other embodiments, the first sidewall spacer 211 may be formed directly on the sidewalls of the opening.

The first sidewall spacer 211 may be made of silicon nitride (SiN).

The first sidewall spacer 211 may be made of a different material as the interlayer dielectric layer inside the opening 209. In the subsequent process to remove the dummy gate structure 204, the etching rate of the first sidewall spacer 211 and the interlayer dielectric layer may be different. Correspondingly the first sidewall spacer 211 may protect the interlayer dielectric layer.

The thickness of the first sidewall spacer 211 may be about 2 nm to about 3 nm. If the thickness of the first sidewall spacer 211 is less than 2 nm, the first wall 211 could not provide enough protecting capability on the interlayer dielectric layer in the subsequent process to removing the dummy gate structure. This would make the interlayer dielectric layer be etched through and affect the performance of the formed SRAM cell. If the thickness of the first sidewall spacer 211 is larger than 3 nm, the size of the opening 209 along the extending direction of the dummy gate structure 204 would decrease, and it would be difficult to form the interlayer dielectric layer inside the opening 209.

Figure 12:
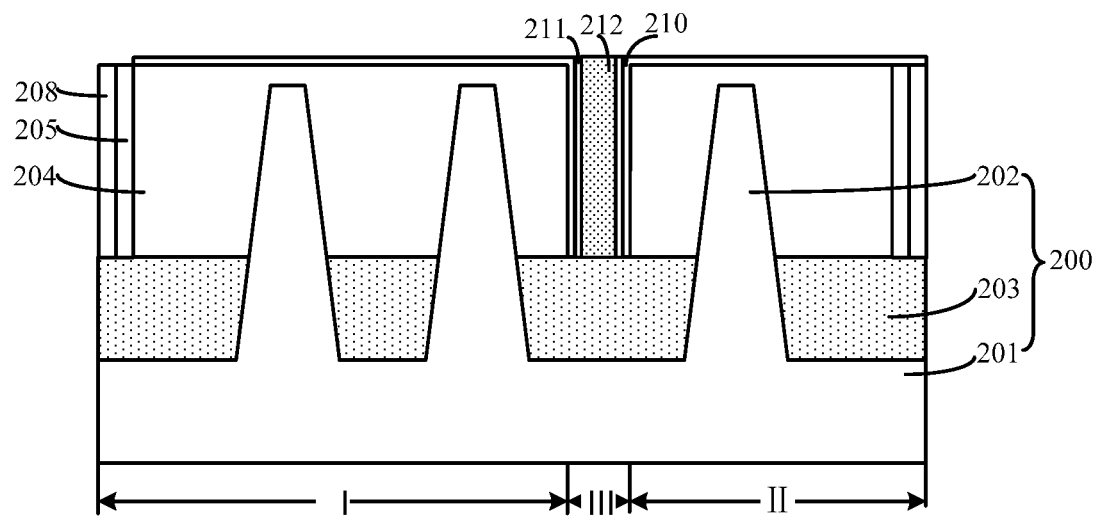

FIG. 12 shows the formation of the interlayer dielectric layer 212 inside the opening 209 after forming the first sidewall spacer 211 (e.g., in Step S810 in FIG. 14). The interlayer dielectric layer may have a top surface coplanar with the dummy gate structure 204.

The processes for forming the interlayer dielectric layer 212 may include: forming an interlayer dielectric film inside the opening 209 and on the dummy gate structure 204; planarizing the interlayer dielectric film to expose the top surface of the dummy gate structure and forming the interlayer dielectric layer 212.

The thickness of the first sidewall spacer 211 and the second sidewall spacer 210 on the sidewalls of the opening 209 may be small and may have a small influence on the size of the opening 209 along the length direction of the channel in the dummy gate structure 204. Subsequently, it may be easy to form the interlayer dielectric layer inside the opening 209.

The interlayer dielectric layer may be used to isolate the gate structure of the pull-up transistor in the first region I and the gate structure of the output transistor in the second region II.

Figure 13:
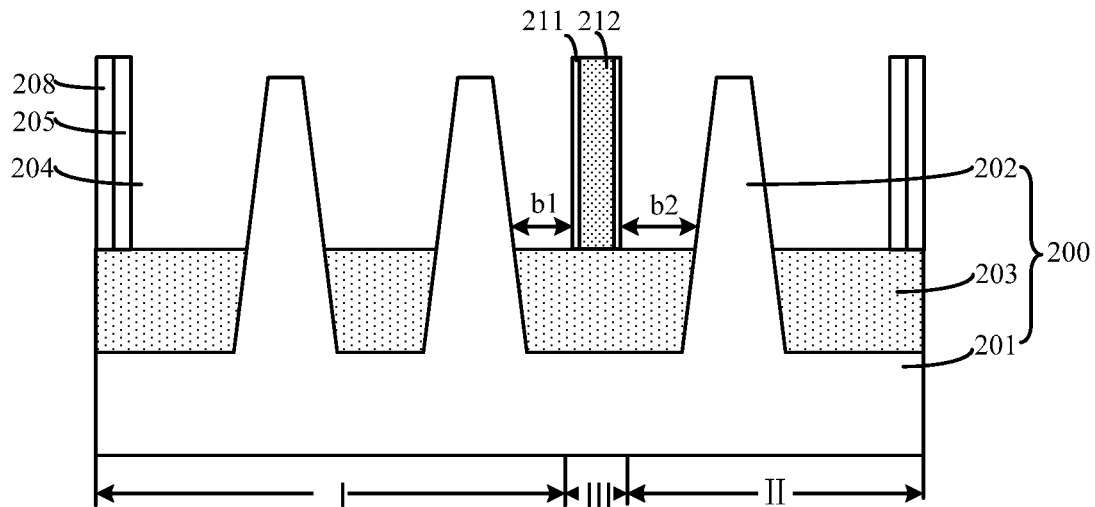
Figure 14:
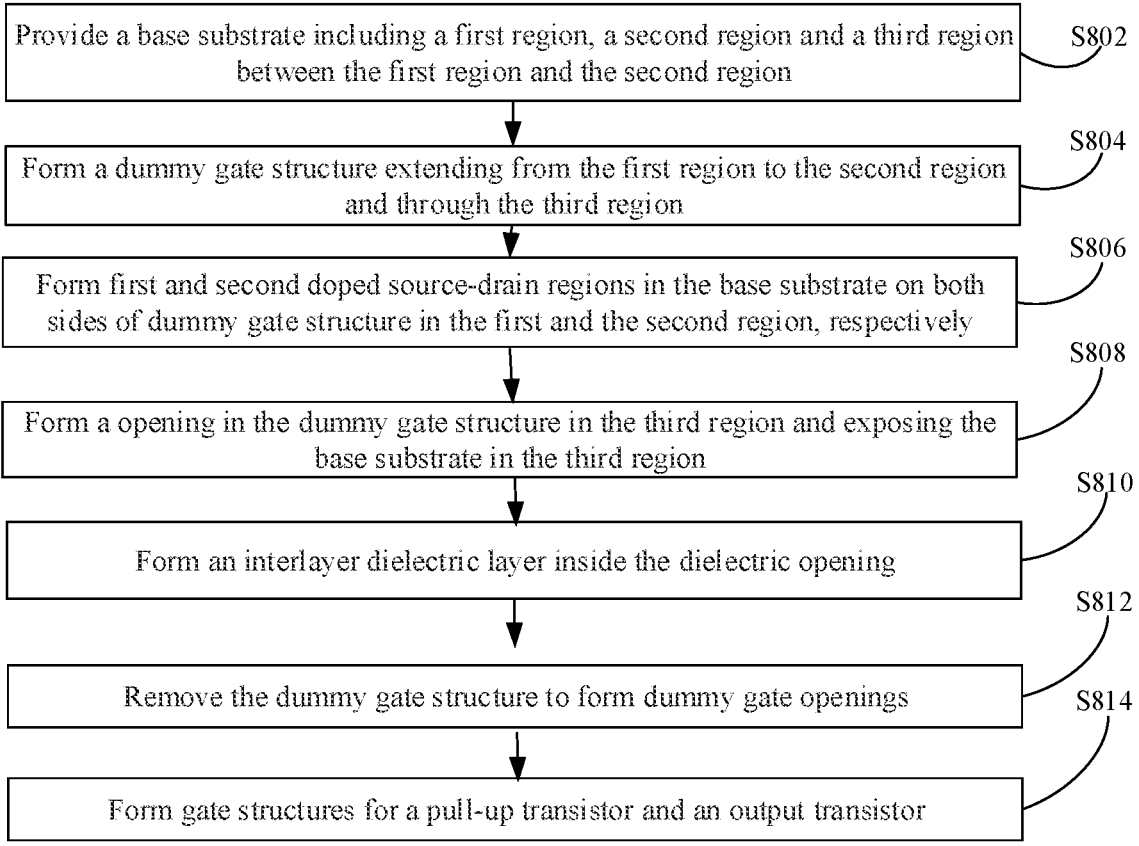
FIG. 14 illustrates an exemplary method for forming a semiconductor structure according to various disclosed embodiments of the present disclosure.

FIG. 13 shows the formation of the gate structures (e.g., in Step S812 and S814 in FIG. 14). Forming the gate structures may include: removing the dummy gate structure 204 in the first region I to form a first dummy gate opening; forming a first gate material layer inside the first dummy gate opening; planarizing the first gate material layer to expose the top surface of the interlayer dielectric layer, to form the gate structure of the pull-up transistor; removing the dummy gate structure 204 in the second region II to form a second dummy gate opening; forming a second gate material layer inside the second dummy gate opening; planarizing the second gate material layer to expose the top surface of the interlayer dielectric layer, to form the gate structure of the output transistor.

The processes for removing the dummy gate structure 204 in the first region I may include: removing the dummy gate layer in the first region I; and removing the dummy gate dielectric layer in the first region I afterward.

The method to remove the dummy gate layer and the dummy gate dielectric layer in the first region I may be a dry etching process or a wet etching process.

The processes for forming the first gate material layer may include: forming an interface layer inside the first dummy gate opening; forming a high-k dielectric layer on the interface layer; forming a work function layer on the high-k dielectric layer; forming a metal silicide layer on the work function layer; and forming a metallic material layer on the metal silicide layer.

The fin 202 in the first region I which is the closest one to the third region III may be defined as the first fin.

The second sidewall spacer 210 may be formed by consuming a portion of the sidewalls of the opening 209 by the plasma oxidization process. The second sidewall spacer 210 may be made of silicon oxide as same as the material of the dummy gate dielectric layer in the first region I. The second sidewall spacer 210 may also be removed in the process to remove the dummy gate dielectric layer in the first region I. The removing of the second sidewall spacer 210 may make the distance from the sidewalls of the first fin to the sidewalls of the first dummy gate opening bigger, and also may make it easier to fill the first dummy gate opening with the first gate material layer. Correspondingly, the formed gate structure of the pull-up transistor and then the SRAM cell may have better performance.

The processes to remove the dummy gate structure 204 in the second region II may include: removing the dummy gate layer in the second region II; and removing the dummy gate dielectric layer in the second region II afterward.

The method to remove the dummy gate layer and the dummy gate dielectric layer in the second region II may be a dry etching process or a wet etching process.

The processes for forming the second gate material layer include: forming an interface layer inside the second dummy gate opening; forming a high-k dielectric layer on the interface layer; forming a work function layer on the high-k dielectric layer; forming a metal silicide layer on the work function layer; and forming a metallic material layer on the metal silicide layer.

The fin 202 in the second region II which is the closest to the third region III is defined as the second fin.

The second sidewall spacer 210 may be formed by consuming a portion of the sidewalls of the opening 209 by the plasma oxidization process. The second sidewall spacer 210 may be made of silicon oxide same as the material of the dummy gate dielectric layer in the second region II. The second sidewall spacer 210 may also be removed in the process to remove the dummy gate dielectric layer in the second region I. The removing of the second sidewall spacer 210 may make the distance from the sidewalls of the second fin to the sidewalls of the second dummy gate opening bigger, and also may make it easier to fill the second dummy gate opening with the second gate material layer. Correspondingly, the formed gate structure of the output transistor and then the SRAM cell may have better performance.

This disclosure embodiment also provides a semiconductor structure using the above method, as shown in FIG. 9, including: a base substrate 200 including a first region, a second region and a third region between the first and second region; a dummy gate structure 204 extending from the first region I to the second region II and through the third region III; first doped source/drain regions 206 in the base substrate 200 on both sides of the dummy gate structure 204 in the first region; second doped source/drain regions 207 in the base substrate 200 on both sides of the dummy gate structure 204 in the second region II; and an opening 209 extending through the dummy gate structure 204 and exposing the base substrate in the third region III.

In the present disclosure, the size of the opening 209 along the extending direction of the dummy gate structure 204 may be 20 nm to 40 nm.

The present disclosure at least has the following advantages.

In the disclosed method, the opening through the dummy gate structure is formed after forming the first and second doped source/drain region. The size of the subsequent opening along the extending direction of the dummy gate structure is not affected when forming the first and second doped source/drain regions, and it is easy to form the interlayer dielectric layer in the opening subsequently. Moreover, the opening does not need to be too large because of the above reasons. The fabricating space for forming the dummy gate structure will be larger if the size of the opening along the extending direction of the dummy gate structure is smaller because the total space for forming the opening and the dummy gate structure is fixed. In the subsequently post gate process, the dummy gate opening is usually formed by removing the dummy gate structure and the gate structure is formed inside the dummy gate opening. The larger space of the dummy gate structure may make the formed dummy gate opening larger. Correspondingly, it may be easy to form the gate structure inside the dummy gate opening and the formed gate structure may have good performance.

In one embodiment of the present disclosure, the first protecting layer is formed on the base substrate of the second and third region, on the dummy gate structure of the second and third region, before forming the first doped source/drain region. The first protecting layer is formed before forming the opening, so it has no influence on the size of the subsequent opening along the extending direction of the dummy gate structure and it is easy to form the interlayer dielectric layer in the opening subsequently. Moreover, it may effectively prevent the opening from becoming excessively large as long as the interlayer dielectric layer can be formed inside the opening since the sidewalls and the bottom of the opening are not covered by the first protecting layer.

In one embodiment of the present disclosure, the second protecting layer is formed on the base substrate of the first and third region, on the dummy gate structure of the first and third region, before forming the second doped source/drain region. The second protecting layer is formed before forming the opening, so it has no influence on the size of the subsequent opening along the extending direction of the dummy gate structure and it is easy to form the interlayer dielectric layer in the opening subsequently. Moreover, it may effectively prevent the opening from becoming excessively large as long as the interlayer dielectric layer can be formed inside the opening since the sidewalls and the bottom of the opening are not covered by the second protecting layer.

Moreover, for an SRAM cell, the total manufacturing space of the pull-up transistors, the output transistors, and the interlayer dielectric layer between the gate structure of the pull-up transistor and the gate structure of the output transistor is fixed, so the opening for forming the interlayer dielectric layer cannot be too large, otherwise the space for forming the pull-up and output transistors is too small. Subsequently, the dummy gate structure in the first region is removed to form the first dummy gate opening, and the gate structure of the pull-up transistor is formed inside the first dummy gate opening. Because the size of the first dummy gate opening in the extending direction of the dummy gate structure is large, it is easy to form the gate structure of the pull-up transistor inside and the formed gate structure of the pull-up transistor has good performance. Then the dummy gate structure in the second region is removed to form the second dummy gate opening, and the gate structure of the output transistor is formed inside the second dummy gate opening. Because the size of the second dummy gate opening in the extending direction of the dummy gate structure is large, it is easy to form the gate structure of the output transistor inside and the formed gate structure of the output transistor has good performance. Correspondingly the performance of SRAM is improved.

In the semiconductor structure formed by the method of this disclosure, the dummy gate structure in the first region is used to form the gate structure of the pull-up transistor, and the dummy gate structure in the second region is used to form the gate structure of the output transistor. The interlayer dielectric layer in the third region is used to isolate the dummy gate structure between the pull-up transistor and the output transistor. The isolation capability of the interlayer dielectric layer is good, and then the formed SRAM has good performance.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor structure, comprising:
    providing a base substrate including a first region, a second region, and a third region between the first region and the second region;
    forming a dummy gate structure extending from the first region to the second region and through the third region;
    forming first doped source/drain regions in the base substrate on both sides of the dummy gate structure in the first region;
    forming second doped source/drain regions in the base substrate on both sides of the dummy gate structure in the second region;
    after forming the first doped source/drain regions and the second doped source/drain regions, forming an opening in the dummy gate structure in the third region, exposing the base substrate in the third region;
    forming an interlayer dielectric layer inside the opening, wherein the interlayer dielectric layer has a top surface coplanar with the dummy gate structure; and
    forming a first sidewall spacer formed on sidewalk of the opening before forming the interlayer dielectric layer and forming a second sidewall spacer on the sidewalls of the opening before forming the first sidewall spacer.

2. The fabrication method according to claim 1, wherein the second sidewall spacer is made of a material including silicon oxide and has a thickness of about 10 angstroms to about 50 angstroms.

3. The fabrication method according to claim 1, further including:
    after forming the interlayer dielectric layer, forming a dummy gate opening by removing the dummy gate structure including a dummy gate dielectric layer and a dummy gate layer on the dummy gate dielectric layer, wherein the second sidewall spacer is removed, when removing the dummy gate dielectric layer.

4. The fabrication method according to claim 1, wherein:
    the first region is used to form a pull-up transistor and the second region is used to form an output transistor; and
    the third region is used to form the interlayer dielectric layer between gate structures of the pull-up transistor and the output transistor.

5. The fabrication method according to claim 4, wherein the gate structure of the pull-up transistor is formed by:
    removing the dummy gate structure in the first region to form a first dummy gate opening;
    forming a first gate material layer in the first dummy gate opening; and
    planarizing the first gate material layer to expose a surface of the interlayer dielectric layer.

6. The fabrication method according to claim 4, wherein the gate structure of the output transistor is formed by:
    removing the dummy gate structure in the second region to form a second dummy gate opening;
    forming a second gate material layer in the second dummy gate opening; and
    planarizing the second gate material layer to expose a surface of the interlayer dielectric layer.

7. The fabrication method according to claim 1, wherein the base substrate includes:
    a semiconductor substrate with fins protruding from the semiconductor substrate;
    an isolation structure on the semiconductor substrate between the fins, wherein the isolation structure has a top surface lower than a top surface of the tins, covers a portion of sidewalls of the fins and through the dummy gate structure;
    a dummy gate structure covering a portion of the sidewalls and the top surface of the fins; and
    the opening exposing the top surface of the isolation structure in the third region.

8. The fabrication method according to claim 1, wherein forming the first doped source/drain regions include:
    forming first openings in the base substrate on both sides of the dummy gate structure in the first region using an etching process;
    forming epitaxial layers in the first openings by a selective epitaxial deposition method;
    and doping the epitaxial layers to form the first doped source/drain regions.

9. The fabrication method according to claim 1, further including:

forming a first protecting layer on the base substrate and the dummy gate structure, in the second and third regions, before forming the first doped source/drain regions, wherein the first protecting layer has a thickness of about 6 nm to about 10 nm.

10. The fabrication method according to claim 9, wherein forming the first protecting layer includes:
   forming a first protecting film on the base substrate and the dummy gate structure, in the first, second and third regions; and
   removing a portion of the first protecting film from the base substrate and the dummy gate structure, in the first region.

11. The fabrication method according to claim 1, further including:
   forming a second protecting layer on the base substrate and the dummy gate structure, in the first and third regions, before forming the second doped source/drain regions, wherein the second protecting layer has a thickness of about 6 nm to about 10 nm.

12. The fabrication method according to claim 11, wherein forming the second protecting layer include:
   forming a second protecting film on the base substrate and the dummy gate structure, in the first, second and third regions; and
   removing a portion of the second protecting film from the base substrate and the dummy gate structure, in the second region.

13. The fabrication method according to claim 1, wherein forming the second doped source/drain regions include:
   forming second openings in the base substrate on both sides of the dummy gate structure in the second region using an etching process;
   forming epitaxial layers in the second openings by a selective epitaxial deposition method; and
   doping the epitaxial layers to form the second doped source/drain regions.

14. The fabrication method according to claim 1, wherein a size of the opening along an extending direction of the dummy gate structure is about 20 nm to about 40 nm.

15. The fabrication method according to claim 1, further including:
   removing the dummy gate structure to form a dummy gate opening, after forming the interlayer dielectric layer.

16. The fabrication method according to claim 15, wherein the dummy gate structure includes a dummy gate dielectric layer and a dummy gate layer on the dummy gate dielectric layer.

17. The fabrication method according to claim 1, wherein the first sidewall spacer is made of a material including silicon nitride, and has a thickness of about 2 nm to about 3 nm.

* * * * *